US006517735B2

(12) United States Patent
Trueba et al.

(10) Patent No.: US 6,517,735 B2
(45) Date of Patent: Feb. 11, 2003

(54) INK FEED TRENCH ETCH TECHNIQUE FOR A FULLY INTEGRATED THERMAL INKJET PRINTHEAD

(75) Inventors: Kenneth E. Trueba, Philomath, OR (US); Charles C. Haluzak, Corvallis, OR (US); David R. Thomas, Corvallis, OR (US); Colby Van Vooren, Corvallis, OR (US)

(73) Assignee: Hewlett-Packard Company, Palo Alto, CA (US)

( * ) Notice: Subject to any disclaimer, the term of this patent is extended or adjusted under 35 U.S.C. 154(b) by 117 days.

(21) Appl. No.: 09/811,052

(22) Filed: Mar. 15, 2001

(65) Prior Publication Data

US 2002/0129495 A1 Sep. 19, 2002

(51) Int. Cl.[7] ............................ H01L 21/00; B44C 1/22

(52) U.S. Cl. ............................... 216/27; 216/2; 216/56; 216/99; 438/753; 438/756

(58) Field of Search ................................ 216/2, 27, 56, 216/99; 438/745, 753, 756; 346/140.1

(56) References Cited

U.S. PATENT DOCUMENTS 4,789,425 A 12/1988 Drake et al. ................ 156/644
4,864,329 A 9/1989 Kneezel et al. ............. 346/140

FOREIGN PATENT DOCUMENTS

EP 0 244 214 A1 4/1987
EP 0841167 A2 5/1998

*Primary Examiner*—William A. Powell

(57) ABSTRACT

A monolithic inkjet printhead formed using integrated circuit techniques is described. A silicon substrate has formed on its top surface a thin polysilicon layer in the area in which a trench is to be later formed in the substrate. The edges of the polysilicon layer align with the intended placement of ink feed holes leading into ink ejection chambers. Thin film layers, including a resistive layer, are formed on the top surface of the silicon substrate and over the polysilicon layer. An orifice layer is formed on the top surface of the thin film layers to define the nozzles and ink ejection chambers. A trench mask is formed on the bottom surface of the substrate. A trench is etched (using, for example, TMAH) through the exposed bottom surface of the substrate and to the polysilicon layer. The etching of the polysilicon layer exposes fast etch planes of the silicon. The TMAH then rapidly etches the silicon substrate along the etch planes, thus aligning the edges of the trench with the polysilicon. A wet etch is then performed using a buffered oxide etch (BOE) solution. The BOE will completely etch through the exposed thin film layers on the topside and underside of the substrate, forming ink feed holes through the thin film layers. The trench is now aligned with the ink feed holes due to the polysilicon layer.

20 Claims, 4 Drawing Sheets

INK FEED TRENCH ETCH TECHNIQUE FOR A FULLY INTEGRATED THERMAL INKJET PRINTHEAD

FIELD OF THE INVENTION

This invention relates to inkjet printers and, more particularly, to a monolithic printhead for an inkjet printer.

BACKGROUND

Inkjet printers typically have a printhead mounted on a carriage that scans back and forth across the width of a sheet of paper feeding through the printer. Ink from an ink reservoir, either on-board the carriage or external to the carriage, is fed to ink ejection chambers on the printhead. Each ink ejection chamber contains an ink ejection element, such as a heater resistor or a piezoelectric element, which is independently addressable. Energizing an ink ejection element causes a droplet of ink to be ejected through a nozzle for creating a small dot on the medium. The pattern of dots created forms an image or text.

Additional information regarding one particular type of printhead and inkjet printer is found in U.S. Pat. No. 5,648,806, entitled, “Stable Substrate Structure For A Wide Swath Nozzle Array In A High Resolution Inkjet Printer,” by Steven Steinfield et al., assigned to the present assignee and incorporated herein by reference.

As the resolutions and printing speeds of printheads increase to meet the demanding needs of the consumer market, new printhead manufacturing techniques and structures are required.

SUMMARY

Described herein is a monolithic printhead formed using integrated circuit techniques.

A silicon substrate has formed on its top surface a thin polysilicon layer in the area in which a trench is to be later formed in the substrate. The edges of the polysilicon layer align with the intended placement of ink feed holes leading into ink ejection chambers. Thin film layers, including a resistive layer, are then formed on the top surface of the silicon substrate. The thin film layers include oxide layers formed over the polysilicon layer. The various layers are etched to provide conductive leads to the heater resistor elements. Piezoelectric elements may be used instead of the resistive elements.

At least one ink feed hole is partially formed through the thin film layers for each ink ejection chamber, leaving the oxide layers over the polysilicon layer in the ink feed hole areas.

An orifice layer is formed on the top surface of the thin film layers to define the nozzles and ink ejection chambers. In one embodiment, a photo-definable material is used to form the orifice layer.

A trench mask is formed on the bottom surface of the substrate. A trench is etched (using, for example, TMAH) through the exposed bottom surface of the substrate. When the substrate is etched to the polysilicon layer, the TMAH rapidly etches away the polysilicon sandwiched between the silicon substrate and the oxide layers, creating a gap between the silicon substrate and the oxide layers. This gap exposes fast etch planes of the silicon. Such fast etch planes may be, for example, (110) and others. The TMAH then rapidly etches the silicon substrate along the etch planes, thus aligning the edges of the trench with the polysilicon edges.

The lateral (in the plane of the wafer) trench etch rate during this rapid etch has been shown in simulations to be 100 microns or more per hour as compared with the lateral component of purely (111) plane etching, which is usually 2–6 microns per hour. The rapid lateral etch rate is almost twice as fast as the vertical etch rate along the <100> direction.

A wet etch is then performed using a buffered oxide etch (BOE) solution. The etchant enters the ink chambers through the nozzles and etches the exposed oxide layers in the ink feed hole areas from the topside. The oxide layers exposed by the trench are also etched from the underside during the same wet etching step. Thus, the wet etching, without the use of any masks, quickly etches the exposed oxide layers from the topside and underside. The BOE will completely etch through the exposed oxide layers forming ink feed holes through the thin film layers. The trench is aligned with the ink feed holes due to the polysilicon layer.

This process allows some misalignment of the trench mask without affecting the final trench dimensions.

The resulting fully integrated thermal inkjet printhead can be manufactured to a very precise tolerance since the entire structure is monolithic, meeting the needs for the next generation of printheads.

The process may be used to form openings in devices other than printheads.

DETAILED DESCRIPTION OF THE EMBODIMENTS

Figure 1:
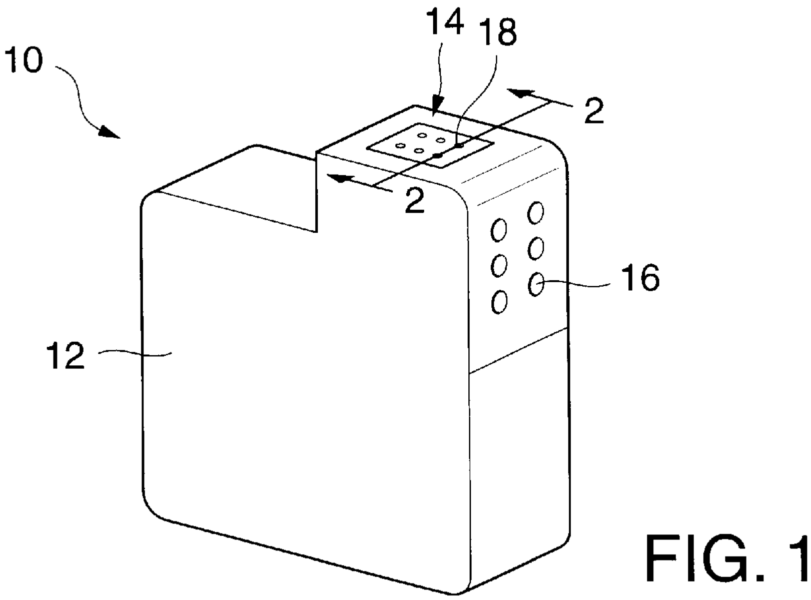
FIG. 1 is a perspective view of one embodiment of a print cartridge that may incorporate the printheads described herein.

FIG. 1 is a perspective view of one type of inkjet print cartridge 10 which may incorporate the printhead structures of the present invention. The print cartridge 10 of FIG. 1 is the type that contains a substantial quantity of ink within its body 12, but another suitable print cartridge may be the type that receives ink from an external ink supply either mounted on the printhead or connected to the printhead via a tube.

The ink is supplied to a printhead 14. Printhead 14, to be described in detail later, channels the ink into ink ejection chambers, each chamber containing an ink ejection element. Electrical signals are provided to contacts 16 to individually energize the ink ejection elements to eject a droplet of ink through an associated nozzle 18. The structure and operation of conventional print cartridges are very well known.

Figure 2:
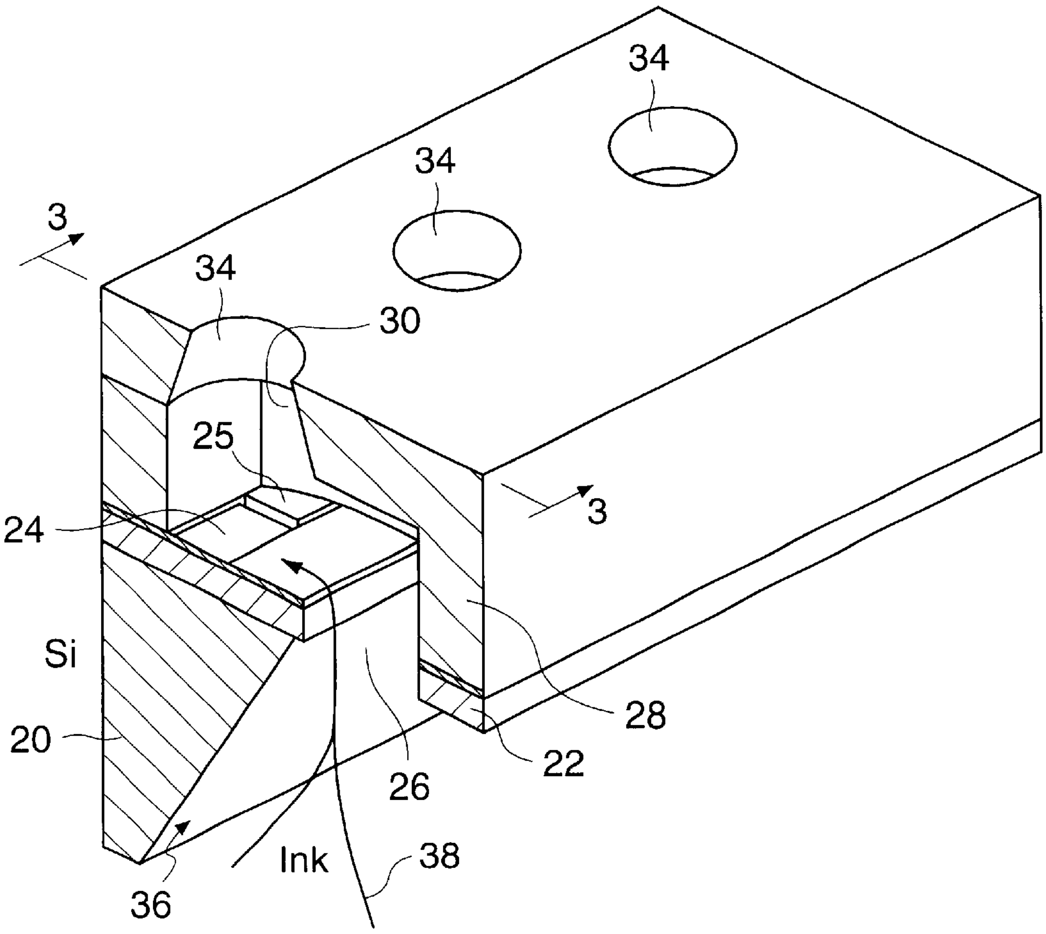
FIG. 2 is a perspective cutaway view of a portion of one embodiment of a printhead in accordance with the present invention.

FIG. 2 is a cross-sectional view of a portion of the printhead of FIG. 1 taken along line 2—2 in FIG. 1.

Although a printhead may have 300 or more nozzles and associated ink ejection chambers, detail of only a single ink ejection chamber need be described in order to understand the invention. It should also be understood by those skilled in the art that many printheads are formed on a single silicon wafer and then separated from one another using conventional techniques.

In FIG. 2, a silicon substrate 20 has formed on it various thin film layers 22, to be described in detail later. The thin film layers 22 include a resistive layer for forming resistors 24. Other thin film layers perform various functions, such as providing electrical insulation from the substrate 20, providing a thermally conductive path from the heater resistor elements to the substrate 20, and providing electrical conductors to the resistor elements. One electrical conductor 25 is shown leading to one end of a resistor 24. A similar conductor leads to the other end of the resistor 24. In an actual embodiment, the resistors and conductors in a chamber would be obscured by overlying layers.

Ink feed holes 26 are formed completely through the thin film layers 22. Each ink feed hole 26 may be larger or smaller than that shown in FIG. 2. There may be multiple holes per chamber. A manifold may be formed in the orifice layer 28 for providing a common ink channel for a row of ink ejection chambers 30.

An orifice layer 28 is deposited over the surface of the thin film layers 22 and etched to form ink ejection chambers 30, one chamber per resistor 24. Nozzles 34 may be formed using conventional photolithographic techniques.

The silicon substrate 20 is etched to form a trench 36 extending along the length of the row of ink feed holes 26 so that ink 38 from an ink reservoir may enter the ink feed holes 26 for supplying ink to the ink ejection chambers 30. A thin film sacrificial layer (e.g., polysilicon), described below, is used to precisely align the edges of the trench 36 with the ink feed holes 26. The polysilicon or other sacrificial layer must have an etch rate greater than the lateral etch rate of the silicon wafer for the sacrificial layer to have beneficial properties.

In one embodiment, each printhead is approximately one-half inch long and contains two offset rows of nozzles, each row containing 150 nozzles for a total of 300 nozzles per printhead. The printhead can thus print at a single pass resolution of 600 dots per inch (dpi) along the direction of the nozzle rows or print at a greater resolution in multiple passes. Greater resolutions may also be printed along the scan direction of the printhead. Resolutions of 1200 or greater dpi may be obtained using the present invention.

In operation, an electrical signal is provided to heater resistor 24, which vaporizes a portion of the ink to form a bubble within the ink ejection chamber 30. The bubble propels an ink droplet through an associated nozzle 34 onto a medium. The ink ejection chamber is then refilled by capillary action.

Figure 3:
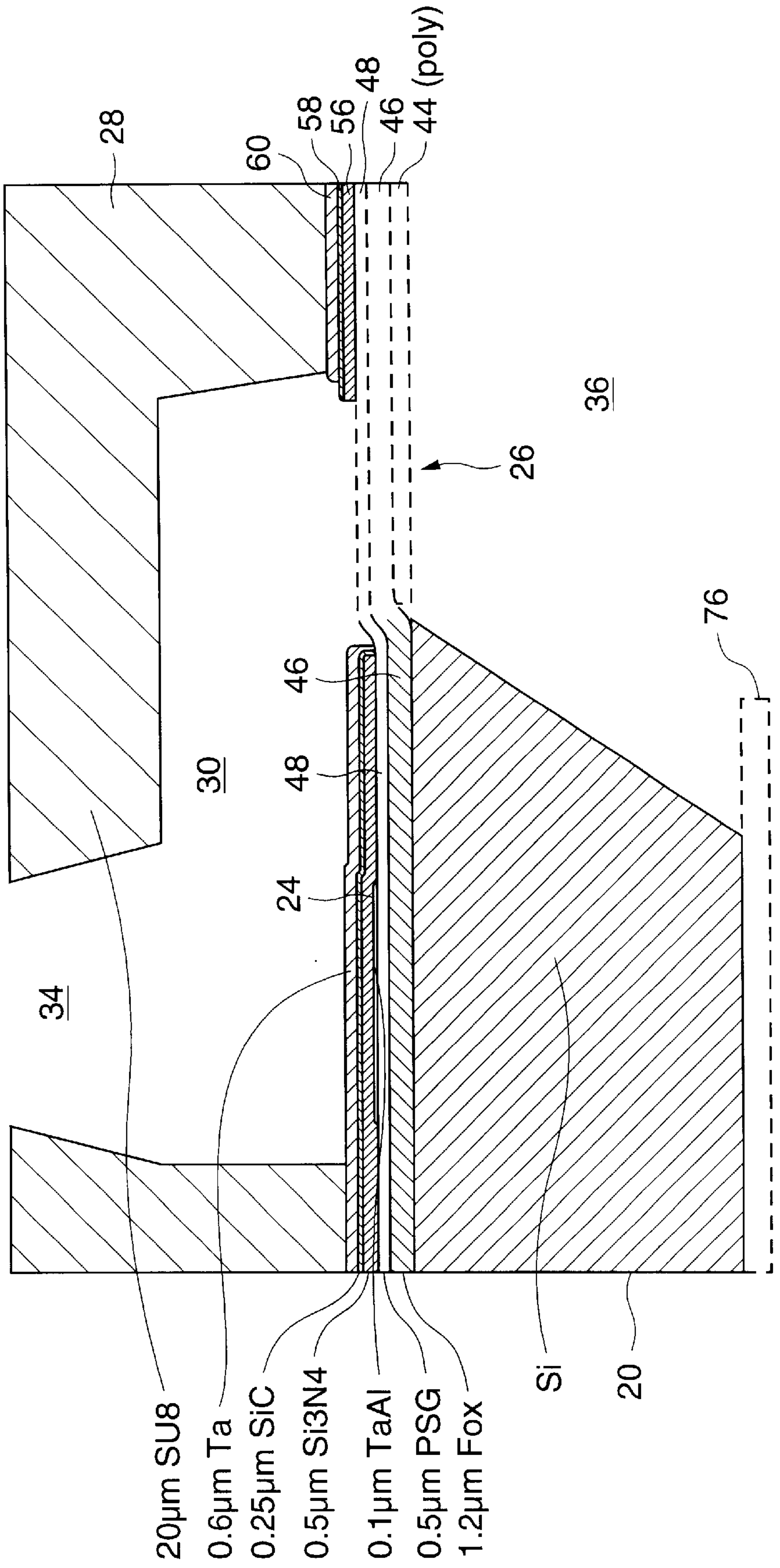
FIG. 3 is a cross-sectional view of the printhead portion of FIG. 2 along line 3—3 showing additional detail of the thin film layers.

FIG. 3 is a cross-sectional view along line 3—3 of FIG. 2 showing a single ink ejection chamber 30 and the associated structure of the printhead. FIG. 3 shows one embodiment of the individual thin film layers. Layers etched away during the TMAH trench etch and BOE wet etch are shown in ghost outline. Conventional deposition, masking, and etching steps are used unless otherwise noted.

To form the structure of FIG. 3, a silicon substrate 20 with a crystalline orientation of <100> is placed in a vacuum chamber. The bulk silicon is about 675 microns thick.

Figure 4:
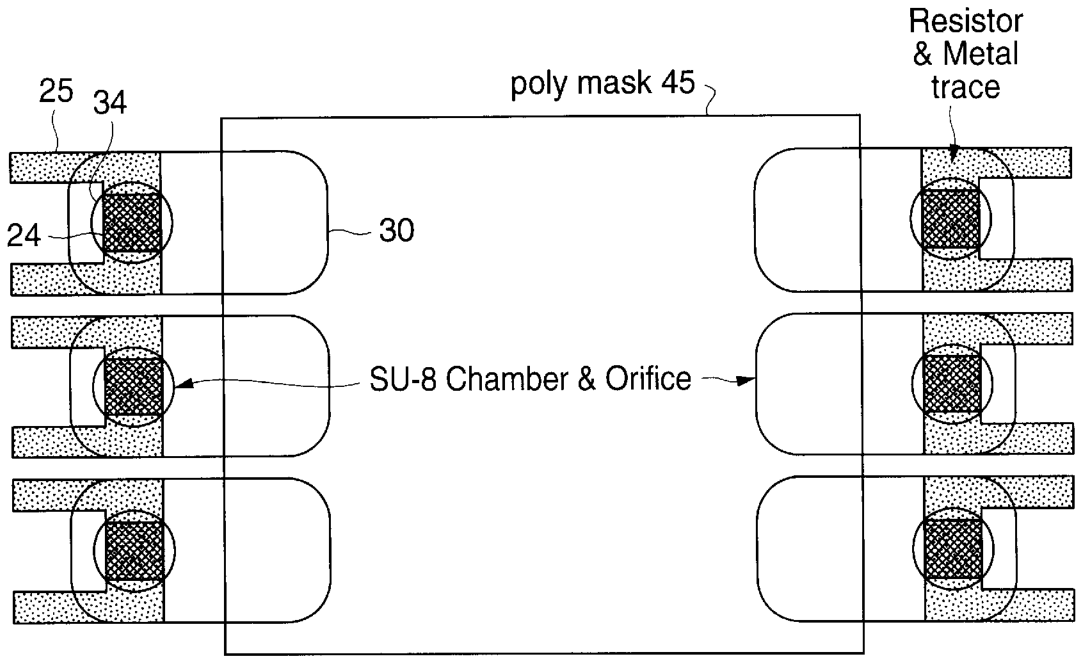
FIG. 4 is a top down partially transparent view of the printhead shown in FIG. 2, showing additional portions of the printhead.

A polysilicon layer 44 (shown in ghost outline), having a thickness of between approximately 0.1 and 0.5 microns, is formed over the top surface of the substrate 20. The polysilicon layer 44 is masked and etched to leave polysilicon only in the area where the trench 36 is to be formed. FIG. 4 is a top down view of a portion of the fully processed wafer showing the location of the poly mask 45. The edges of the polysilicon layer 44 will define the edges of the trench 36. It is important that the edges of the trench not affect the intended size of the ink feed holes 26 leading into the ink ejection chambers 30 because the size of the ink feed holes 26 is carefully calculated to provide a certain fluid resistance for optimum performance of the printhead. It is difficult to obtain repeatable trench dimensions by only using a backside trench mask followed by a TMAH etch of the substrate. The process described herein uses the polysilicon layer 44 dimensions to define the trench edges so that the backside trench mask can be misaligned without affecting the final trench dimensions. Since the polysilicon layer 44 can be patterned with high precision with respect to the intended ink feed holes 26, the resulting trench edges can be precisely aligned with the ink feed holes 26.

Although the poly mask 45 in FIG. 4 patterns the polysilicon layer 44 to extend over the entire trench area, the polysilicon layer 44 need only reside along the periphery of the trench area (but not extend beyond the trench area) where the ink feed holes are to be formed. Forming the polysilicon over the entire trench area is beneficial because the polysilicon results in a much faster silicon wafer etch rate in the lateral direction.

Referring back to FIG. 3, a field oxide layer 46, having a thickness of 1.2 microns, is formed over the silicon substrate 20 and polysilicon layer 44 using conventional techniques. Other types of oxide layers may be used, such as oxides of nitrogen (NOX). A phosphosilicate glass (PSG) layer 48, having a thickness of 0.5 microns, is then deposited over the field oxide layer 46 using conventional techniques. A boron PSG or boron TEOS (BTEOS) layer may be used instead of PSG layer 48.

Figure 5:
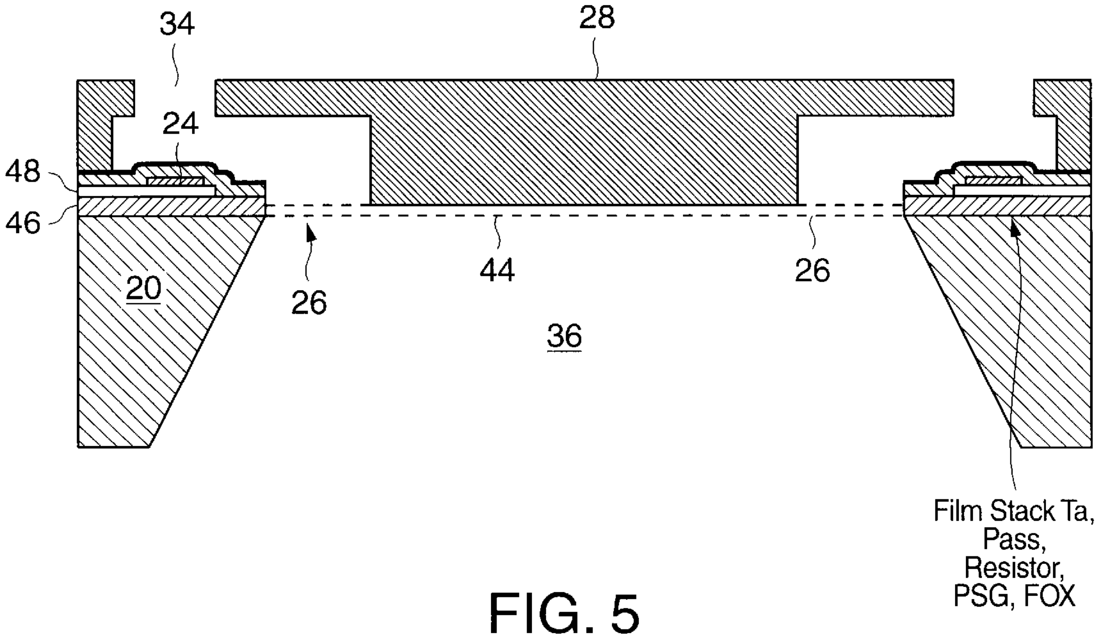
FIG. 5 is a cross-sectional view along line 3—3 in FIG. 2 showing additional portions of the printhead.

In an alternative embodiment, a mask is formed over the PSG layer 48 using conventional photolithographic techniques. The PSG layer 48 is then etched using conventional reactive ion etching (RIE) to pull back the PSG layer 48 from the subsequently formed ink feed hole. This will protect the PSG layer 48 from ink. In such an embodiment, the PSG does not extend over the ink feed hole areas. Such an embodiment is shown in FIG. 5.

A resistive layer (ultimately forming resistors 24) of, for example, tantalum aluminum (TaAl), having a thickness of 0.1 microns, is then the deposited over the PSG layer 48. Other known resistive layers can also be used. A conductive layer 25 (see FIG. 2) of AlCu is then deposited over the TaAl. A mask is deposited and patterned using conventional photolithographic techniques, and the conductive layer 25 and the resistive layer are etched using conventional IC fabrication techniques. Another masking and etching step is used to remove the portions of the AlCu over the heater resistors 24, as shown in FIG. 2. The resulting AlCu conductors are outside the field of view of FIG. 3.

The etching of the conductive layer 25 and resistive layer defines a first resistor dimension (e.g., a width). A second resistor dimension (e.g., a length) is defined by etching the conductive layer 25 to cause the resistive portion to be contacted by the conductive traces at two ends. This technique of forming resistors and electrical conductors is well known in the art. The conductive traces are formed so as to not extend across the middle of the printhead, but run along the edges. Appropriate addressing circuitry and pads are provided on the substrate 20 for providing energizing signals to the resistors 24.

Over the resistors 24 and conductive layer 25 is formed a silicon nitride layer 56, having a thickness of 0.5 microns. This layer provides insulation and passivation.

Over the nitride layer 56 is formed a silicon carbide layer 58, having a thickness of 0.25 microns, to provide additional insulation and passivation. The nitride layer 56 and carbide layer 58 protect the PSG layer 48 from the ink. Other dielectric layers may be used instead of nitride and carbide.

The passivation layers are then masked (outside the field of view) and etched using conventional techniques to expose portions of the conductive layer 25 for electrical contact to a subsequent gold conductive layer to provide ground lines.

A bubble cavitation layer 60 of tantalum (Ta) is then formed over the carbide layer 58. Gold (Au), not shown, is deposited over the tantalum layer 60 and etched to form the ground lines electrically connected to certain ones of the conductive layer 25 traces. The ground lines terminate in bond pads along edges of the substrate 20.

The AlCu and gold conductors may be coupled to transistors formed on the substrate surface. Such transistors are described in U.S. Pat. No. 5,648,806, previously mentioned.

A mask is patterned to expose portions of the thin film layers above the FOX and PSG oxide layers 46 and 48 corresponding to the ink feed holes 26. The thin film layers overlying the oxide layers 46 and 48 in the ink feed hole areas are then etched. Alternately, multiple masking and etching steps may be used as the various thin film layers are formed. This etch process can be a combination of several types of etches (RIE or wet). The etch through the thin film layers may use conventional IC fabrication techniques.

FIG. 3 shows the layers 44, 46, and 48 as ghost layers within the ink feed hole areas, since these layers are ultimately etched away.

An orifice layer 28 is then deposited and formed. The orifice layer 28 may be formed of a spun-on epoxy called SU8. Orifice layer 28 may alternatively be laminated or screened on. The orifice layer in one embodiment is about 20 microns. The ink chambers 30 and nozzles 34 are formed through photolithography. In one technique, a first mask using a half dosage of UV radiation "hardens" the upper surface of the SU8 (a negative photoresist) except in locations where the nozzles 34 are to be formed. A second mask using a full UV dosage then exposes the SU8 in those areas where neither nozzles 34 nor ink ejection chambers 30 are to be formed. After these two exposures, the SU8 is developed, and the hardened portions remain but the nozzle portions and the ink ejection chamber portions of the SU8 are removed.

The backside of the wafer is then masked (by mask 76) using conventional techniques to expose the portion of the backside of the wafer to be subjected to the TMAH trench etch. The backside mask 76 may be a FOX hard mask formed using conventional photolithographic techniques. The wafer is dipped into the wet TMAH etch, which forms the angled profile. The trench width will typically be less than 200 microns, and, in one embodiment, is between 20–60 microns. The backside masking may be misaligned by a large margin but still must be within the intended trench area. Such misalignment would normally restrict the area of the ink feed hole and have an adverse effect on the fluid properties of the printhead. However, the use of the polysilicon layer 44 avoids any adverse effects of such misalignment. The TMAH, after etching through the substrate to the polysilicon layer 44, rapidly etches the polysilicon layer 44, forming a gap between the substrate and the oxide layers 46 and 48. This gap exposes the fast etch planes of the substrate, and the TMAH rapidly etches the substrate so that the edges of the trench align with the polysilicon layer 44 edges.

The trench 36, in one embodiment, extends the length of a row of ink ejection chambers. Any one of several etch techniques could be used. Examples of appropriate wet etches include ethylene diamine pyrocatecol (EDP), potassium hydroxide (KOH), and TMAH. Any one of these or a combination thereof could be used for this application.

The wafer is then subjected to a conventional wet buffered oxide etch (BOE). The BOE etches away the exposed oxide layers 46 and 48 to complete the ink feed holes 26. The BOE etches from both the topside of the oxide layers (from within the ink ejection chambers 30) and the underside of the oxide layers, resulting in a relatively rapid etch. Importantly, no masking is used in the wet etch, since the exposed oxide layers 46 and 48 on the topside and underside of the wafer are already aligned with the ink feed hole areas.

FIG. 5 is a cross-sectional view of a larger portion of the wafer corresponding to the top down view of FIG. 4. The sacrificed polysilicon layer 44 is shown in ghost outline. Any thin film layers beneath the orifice layer 28 are not functional and are not shown.

In the embodiment of FIG. 5, the PSG layer 48 has been pulled back and protected by the overlying passivation layers from ink. Thus, in the embodiment of FIG. 5, the BOE wet etch to complete the ink feed holes 26 only etches through the field oxide layer 46.

The resulting wafer is then sawed to form the individual printheads, A flexible circuit is used to provide electrical access to the conductors on the printhead. The resulting assembly is then affixed to a plastic print cartridge, such as that shown in FIG. 1, and the printhead is sealed with respect to the print cartridge body to prevent ink seepage.

Additional details of forming thin film layers may be found in U.S. application Ser. No. 09/384,817, entitled "Fully Integrated Thermal Inkjet Printhead Having Thin Film Layer Shelf," filed Aug. 27, 1999, by Naoto Kawamura et al., assigned to the present assignee and incorporated herein by reference.

The trench 36 may extend the length of the printhead or, to improve the mechanical strength of the printhead, only extend a portion of the length of the printhead beneath the ink ejection chambers. A passivation layer may be deposited on the substrate 20 if reaction of the substrate with the ink is a concern.

Although polysilicon was used as the sacrificial layer, other materials, such as metals, may be used instead. One suitable metal is titanium, which can be etched with a hydrogen peroxide HF etch. However, polysilicon is preferable since it is etched using the same TMAH etch used to etch the substrate 20.

One skilled in the art of integrated circuit manufacturing would understand the various techniques used to form the printhead structures described herein. The thin film layers and their thicknesses may be varied, and some layers deleted, while still obtaining the benefits of the present invention. Additional ink feed hole patterns are also envisioned.

Figure 6:
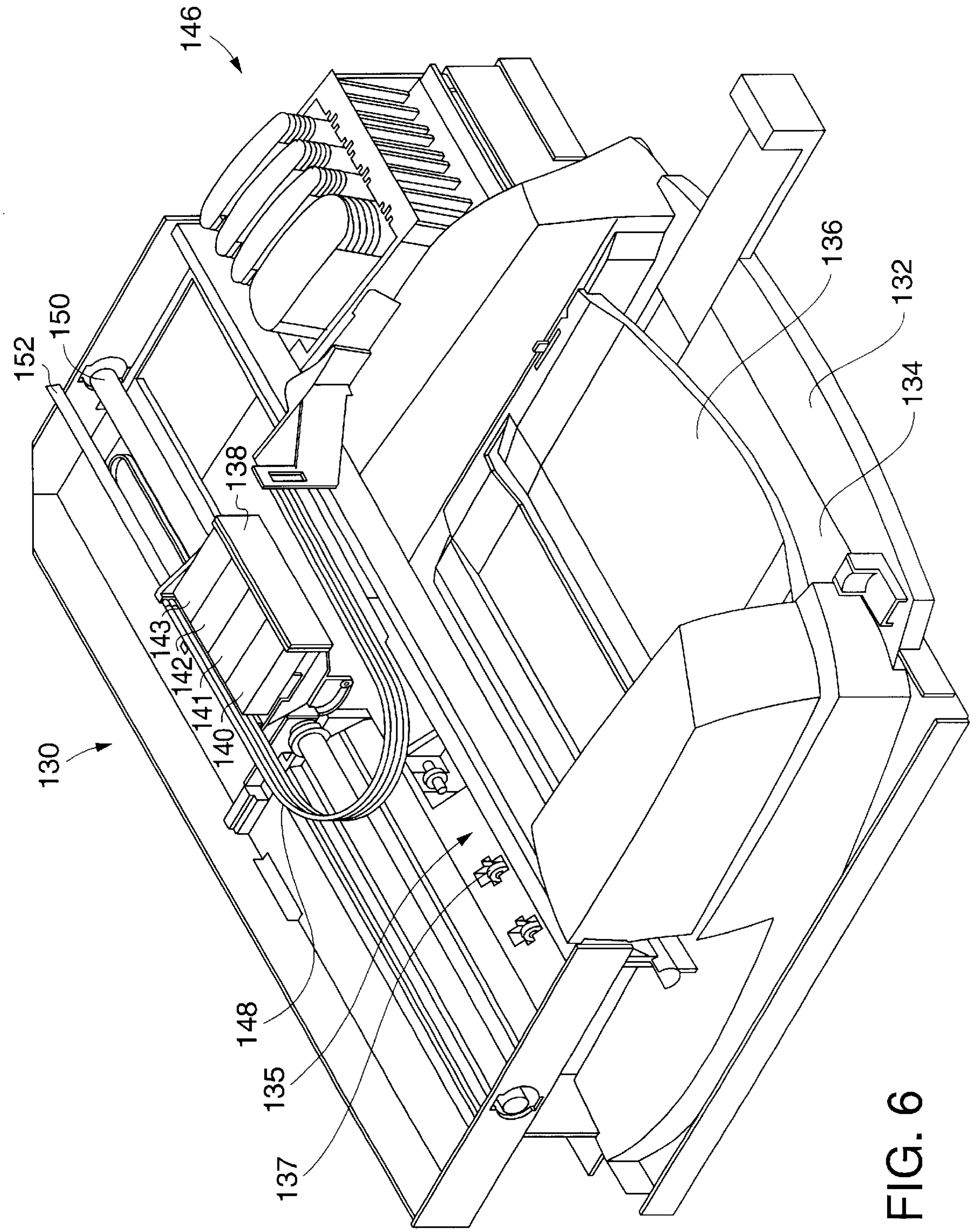
FIG. 6 is a perspective view of a conventional inkjet printer into which the printheads of the present invention may be installed for printing on a medium.

FIG. 6 illustrates one embodiment of an inkjet printer 130 that can incorporate the invention. Numerous other designs of inkjet printers may also be used along with this invention. More detail of an inkjet printer is found in U.S. Pat. No. 5,852,459, to Norman Pawlowski et al., incorporated herein by reference.

Inkjet printer 130 includes an input tray 132 containing sheets of paper 134 which are forwarded through a print zone 135, using rollers 137, for being printed upon. The paper 134 is then forwarded to an output tray 136. A moveable carriage 138 holds print cartridges 140–143, which respectively print cyan (C), black (K), magenta (M), and yellow (Y) ink.

In one embodiment, inks in replaceable ink cartridges 146 are supplied to their associated print cartridges via flexible ink tubes 148. The print cartridges may also be the type that hold a substantial supply of fluid and may be refillable or non-refillable. In another embodiment, the ink supplies are separate from the printhead portions and are removeably mounted on the printheads in the carriage 138.

The carriage 138 is moved along a scan axis by a conventional belt and pulley system and slides along a slide rod 150. In another embodiment, the carriage is stationery, and an array of stationary print cartridges print on a moving sheet of paper.

Printing signals from a conventional external computer (e.g., a PC) are processed by printer 130 to generate a bitmap of the dots to be printed. The bitmap is then converted into firing signals for the printheads. The position of the carriage 13 8 as it traverses back and forth along the scan axis while printing is determined from an optical encoder strip 152, detected by a photoelectric element on carriage 138, to cause the various ink ejection elements on each print cartridge to be selectively fired at the appropriate time during a carriage scan.

The printhead may use resistive, piezoelectric, or other types of ink ejection elements.

As the print cartridges in carriage 138 scan across a sheet of paper, the swaths printed by the print cartridges overlap. After one or more scans, the sheet of paper 134 is shifted in a direction towards the output tray 136, and the carriage 138 resumes scanning.

The present invention is equally applicable to alternative printing systems (not shown) that utilize alternative media and/or printhead moving mechanisms, such as those incorporating grit wheel, roll feed, or drum or vacuum belt technology to support and move the print media relative to the printhead assemblies. With a grit wheel design, a grit wheel and pinch roller move the media back and forth along one axis while a carriage carrying one or more printhead assemblies scans past the media along an orthogonal axis. With a drum printer design, the media is mounted to a rotating drum that is rotated along one axis while a carriage carrying one or more printhead assemblies scans past the media along an orthogonal axis. In either the drum or grit wheel designs, the scanning is typically not done in a back and forth manner as is the case for the system depicted in FIG. 13.

Multiple printheads may be formed on a single substrate. Further, an array of printheads may extend across the entire width of a page so that no scanning of the printheads is needed; only the paper is shifted perpendicular to the array.

Additional print cartridges in the carriage may include other colors or fixers.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for forming a printing device comprising:

providing a printhead substrate;

forming a polysilicon layer over a first surface of said substrate, said polysilicon layer having peripheral portions for defining edges of a trench to be subsequently formed in said substrate, said peripheral portions being aligned with a boundary of ink feed holes, to be later formed;

forming a plurality of thin film layers on said first surface of said substrate, at least one of said layers forming a plurality of ink ejection elements;

forming ink feed openings through at least some of said thin film layers;

forming an orifice layer over said thin film layers, said orifice layer defining a plurality of ink ejection chambers, each chamber having within it an ink ejection element, said orifice layer further defining a nozzle for each ink ejection chamber;

masking a second surface of said substrate to perform a trench etch;

etching said second surface of said substrate using a wet etchant to form a trench, said etching also etching said polysilicon layer, said trench having at least some edges aligned with said peripheral portions of said polysilicon layer; and wet etching portions of said thin film layers exposed through said ink feed openings and by said trench to self-align edges of said trench substantially to said ink feed holes formed completely through said thin film layers.

2. The method of claim 1 wherein said thin film layers include one or more oxide layers, said wet etching away portions of said one or more oxide layers to form said ink feed holes.

3. The method of claim 2 wherein said oxide layers comprises a field oxide layer.

4. The method of claim 2 wherein said oxide layers comprise a PSG layer.

5. The method of claim 2 wherein said oxide layers comprise a NOX layer.

6. The method of claim 1 wherein said orifice layer at least partially defines boundaries of said ink feed holes.

7. The method of claim 1 wherein said etching said second surface of said substrate to form a trench comprises etching said substrate with a TMAH solution to form an angled trench edge with respect to said second surface.

8. The method of claim 1 wherein said wet etching uses a buffered oxide etch.

9. The method of claim 1 wherein said wet etching is performed without a mask.

10. The method of claim 1 wherein said printhead substrate is part of a semiconductor wafer, said method further comprising:

separating out printheads from said wafer; and installing said printheads in print cartridges.

11. The method of claim 10 further comprising installing said print cartridges in inkjet printers.

12. A printing device formed using the method comprising:

providing a printhead substrate;

forming a polysilicon layer over a first surface of said substrate, said polysilicon layer having peripheral portions for defining edges of a trench to be subsequently formed in said substrate, said peripheral portions being aligned with a boundary of ink feed holes, to be later formed;

forming a plurality of thin film layers on said first surface of said substrate, at least one of said layers forming a plurality of ink ejection elements;

forming ink feed openings through at least some of said thin film layers;

forming an orifice layer over said thin film layers, said orifice layer defining a plurality of ink ejection chambers, each chamber having within it an ink ejection element, said orifice layer further defining a nozzle for each ink ejection chamber;

masking a second surface of said substrate to perform a trench etch;

etching said second surface of said substrate using a wet etchant to form a trench, said etching also etching said polysilicon layer, said trench having at least some edges aligned with said peripheral portions of said polysilicon layer; and wet etching portions of said thin film layers exposed through said ink feed openings and by said trench to self-align edges of said trench substantially to said ink feed holes formed completely through said thin film layers.

13. The device of claim 12 wherein said thin film layers include one or more oxide layers, said wet etching etching away portions of said one or more oxide layers to form said ink feed holes.

14. The device of claim 12 wherein said oxide layers comprise a PSG layer.

15. The device of claim 12 wherein said orifice layer at least partially defines boundaries of said ink feed holes.

16. The device of claim 12 wherein said etching said second surface of said substrate to form a trench comprises etching said substrate with a TMAH solution to form an angled trench edge with respect to said second surface.

17. The device of claim 12 wherein said wet etching uses a buffered oxide etch.

18. The device of claim 12 wherein said wet etching is performed without a mask.

19. The device of claim 12 wherein said printhead substrate is part of a semiconductor wafer, said device being further formed by the method comprising:

separating out printheads from said wafer; and installing said printheads in print cartridges.

20. The device of claim 12 further comprising said print cartridges being installed in inkjet printers.

* * * * *